United States Patent [19]
Yoshida

[11] Patent Number: 5,114,868
[45] Date of Patent: May 19, 1992

[54] MANUFACTURING METHOD OF WELL REGION IN COMS INTERGRATED CIRCUIT

[75] Inventor: Hiroshi Yoshida, Tokyo, Japan
[73] Assignee: NEC Corporation, Japan
[21] Appl. No.: 561,191
[22] Filed: Aug. 1, 1990
[30] Foreign Application Priority Data
  Aug. 2, 1989 [JP] Japan .................................. 1-201647
[51] Int. Cl.⁵ ......................................... H01L 21/265
[52] U.S. Cl. ...................................... 437/34; 437/56;
                    437/70; 148/DIG. 9; 357/42
[58] Field of Search ....................... 437/34, 56, 31, 59,
                    437/70, 69; 148/DIG. 9

[56] References Cited
U.S. PATENT DOCUMENTS

| | | | |
|---|---|---|---|
| 4,549,340 | 10/1985 | Nagasawa et al. | 437/70 |
| 4,839,301 | 6/1989 | Lee | 437/34 |
| 4,879,255 | 11/1989 | Deguchi et al. | 437/59 |
| 4,927,776 | 5/1990 | Soejima | 437/59 |
| 4,929,565 | 5/1990 | Parrillo | 437/34 |
| 5,024,961 | 6/1991 | Lee et al. | 437/34 |

Primary Examiner—Olik Chaudhuri
Assistant Examiner—Long Pham
Attorney, Agent, or Firm—Laff, Whitesel, Conte & Saret

[57] ABSTRACT

First, N-type channel stoppers are formed in an element formation region of a P-channel MOS transistor and in an element isolation region of the P-channel MOS transistor, of a CMOS transistor. After forming a field oxide film, an N well is formed in the element formation region of the P-channel MOS transistor. In spite of the fact that the dose of ions used for the formation of an N-type channel stopper is smaller than the dose of ions used for the formation of an N well, the surface concentration of the N-type impurity of the N-type channel stopper is higher than that of the N well. The N-type impurity concentration in the portion where the N-type channel stopper and the N well are brought into contact, becomes uniform. The variability in the threshold voltage of the P-channel MOS transistor, the threshold voltage of the P-channel parasitic MOS transistor, the junction breakdown voltage of the P+ diffused layer and the junction capacitance of the P+ diffused layer is reduced, so that the device obtained is suited for the submicron process.

16 Claims, 8 Drawing Sheets

MANUFACTURING METHOD OF WELL REGION IN COMS INTERGRATED CIRCUIT

BACKGROUND OF THE INVENTION

1. Field of the Invention

The present invention relates to the manufacturing methods of a well region and a channel stopper in a CMOS integrated circuit.

2. Description of the Prior Art

It is known that the performance of a CMOS integrated circuit can be enhanced by reducing the gate length of the CMOS integrated circuit. In that case, it is necessary in general to set the impurity concentration of the wells and a semiconductor substrate at a high level in order to control the short channel effect.

In a P-channel MOS transistor of a CMOS integrated circuit using N-type silicon substrate, there is generally employed an N-type polycrystalline silicon film as a gate electrode material. For this reason, a P-type layer is formed on the surface of an N well by ion implanting P-type impurity ions. This structure is referred to as being of buried channel type.

It should be noted that a straight forward increase of the impurity concentration of the N wells makes the difference from the impurity concentration of the P-type layer formed on the N-well surface small, impairing the controllability of the threshold voltage. Moreover, in the channel region of the P-channel MOS transistor in the N well, the P-type and the N-type impurity concentrations are high and, therefore, the hole mobility is reduced due to scattering, so that the current driving ability of the P-channel MOS transistor will be reduced.

In order to circumvent the above-mentioned difficulties there is known a fabrication method in which the ion implantation for the N-well formation is performed after the formation of the field oxide film and the heat treatment is moderated to suppress the impurity concentration rise in the vicinity of the N-well surface layer. In this case, it is not possible to simultaneously form the N wells and the N-type channel stoppers by the implantation of ions with energy of 100 to 200 keV because the field oxide film requires a thickness of 500 to 800 nm. On the other hand, implantation of ions with energy not less than several hundred kiloelectron volts will permit the simultaneous formation of the N wells and the N-type channel stoppers. However, this is not desirable since the impurity concentration of the N-type channel stoppers will become lower compared with the impurity concentration of the N wells.

For the above-mentioned reasons, the conventional N-type channel stoppers are formed as described in the following.

First, an $SiO_2$ film is formed on an N-type silicon substrate. Then, boron ions are implanted into a region which is to become the element formation region of an N-channel MOS transistor and a region which is to become the element isolation region of an N-channel MOS transistor, by using a first photoresist film as the mask. The ion implantation is performed for the purpose of forming P wells.

Next, after removal of the first photoresist film, an $Si_3N_4$ film is deposited all over the top surface of the N-type silicon substrate. With a second photoresist film as the mask, the $Si_3N_4$ film on the region which is to become the element isolation region of the N-channel MOS transistor and on the region which is to become the element isolation region of a P-channel MOS transistor is removed by etching. The $Si_3N_4$ film on the region which is to become the element formation region of the N-channel MOS transistor and on the region which is to become an element formation region of the P-channel MOS transistor stays there without being removed. Further, in the portion where the N-channel MOS transistor and the P-channel MOS transistor are formed adjacent with each other, the regions that are to become the element isolation regions of the N-channel and the P-channel MOS transistors are situated adjacent with each other.

Next, a third photoresist film is formed, without removing the second photoresist film, on the second photoresist film and on the region which is to become the element isolation region of the P-channel MOS transistor. Boron ions are implanted into the regions which are to become the element isolation region of the N-channel MOS transistors, using the second and the third photoresist films as the mask. This ion implantation is performed to form P-type channel stoppers in the element isolation regions of the N-channel MOS transistors.

Then, the second photoresist film and the third photoresist film are removed.

Following that, a fourth photoresist film is formed ideally on the region other than that which is to become the element isolation region of the P-channel MOS transistor. In other words, the fourth photoresist film is formed on the $Si_3N_4$ film on the regions that are to become the element formation regions of the N-channel MOS transistor and the P-channel MOS transistor, and on the region that is to become the element isolation region of the N-channel MOS transistor. Succeeding the above, phosphorus ions are implanted ideally into the region that is to become the element isolation region of the P-channel MOS transistor, using the fourth photoresist film as the mask. The ion implantation is performed for the purpose of forming an N-type channel stopper in the region.

Next, the fourth photoresist film is removed. A field oxide film is selectively formed in the regions that are to become the element isolation regions of the P-channel and the N-channel MOS transistors, with the $Si_3N_4$ film as the mask. The oxidation is carried out in the oxidizing atmosphere of $H_2$ and $O_2$. Simultaneous with the formation of the field oxide film, there are formed P wells in the region which is to become the element isolation region of the N-channel MOS transistor as well as in the region which is to become the element isolation region of the N-channel MOS transistor; the element isolation region, for the N-channel MOS transistor consisting of the field oxide film and the P-type channel stopper, is formed in the region which is to become the element isolation region of the N-channel MOS transistor, and the element isolation region, for the P-channel MOS transistor consisting of the field oxide film and the N-type channel stopper, is formed in the region which is to become the element isolation region of the P-channel MOS transistor.

In the above, the depth in the vertical direction of the diffused layer of the P-type channel stopper is 0.7 to 1.0 $\mu m$. Further, the depth in the vertical direction of the diffused layer of the N-type channel stopper is 0.19 to 0.24 $\mu m$, and the surface impurity concentration of the N-type channel stopper is $(0.56$ to $1.0) \times 17^{17}$ cm$^{-3}$. Because of this, the sum of the horizontal direction of the P-type channel stopper (or the P well) and the diffused layer of the N-type channel stopper becomes layer than the alignment accuracy. Therefore, no slit will be formed between the N-type channel stopper and the P-type channel stopper (or the P well).

Then, the Si$_3$N$_4$ film is removed. Next, a fifth photoresist film is formed on the P wells. Subsequently, with the fifth photoresist film as the mask, phosphorus ions are implanted. At this time, ions are implanted into the region planned for the element formation region of the P-channel MOS transistor. However, ions will not be implanted into the N-type channel stopper because of the large thickness of the field oxide film.

Next, after removal of the fifth photoresist film, a heat treatment is subjected to the above-obtained substrate. As a result of this treatment, the phosphorus ions implanted into the region planned for the element formation region of the P-channel MOS transistor are activated, and forms an N well in the region. The depth in the vertical direction of the N-well diffused layer is 0.41 to 0.43 $\mu$m, and the surface impurity concentration of the N well is $(0.22$ to $0.4) \times 10^{17}$ cm$^{-3}$. It is to be noted that there is practically no horizontal spread of the N-well diffused layer.

In the manufacturing method of the N well described in the above, the N well itself is formed in self-aligning manner with respect to the field oxide film, but the N-type channel stopper will not be formed in self-aligning manner with respect to the field oxide film. Taking into account even the horizontal spread of the diffused layer of the N-type channel stopper which is smaller than the alignment accuracy, it will be understood that the N well and the N-type channel stopper will not necessarily be brought into contact. The cause of the variability in this situation resides in the presence of alignment deviation of the fourth photoresist film, when the fourth photoresist film is deviated toward the N-well side at one end part of the N well, the impurity concentration of the N well at this end part will become high. At the opposite end part of the N well which faces the end part, the fourth photoresist film is deviated to the side to be away from the N well, so that either the impurity concentration of the N-type channel stopper at this portion becomes lower or the N-type channel stopper will become off-set with respect to the N well.

Due to the circumstances described above, there will arise the following problems. Namely, when the impurity concentration of the N well becomes high at one end part of the N well, the threshold voltage of the P-channel MOS transistor becomes locally high, the junction breakdown voltage of a P+ diffused layer is reduced and the junction capacitance of the P+ diffused layer is increased. On the other hand, when the impurity concentration of the N-type channel stopper becomes low at an end part of the N well or the N-type channel stopper is off-set with respect to the N well, the threshold voltage of the P-channel parasitic MOS transistor at this part becomes low and the junction capacitance of the P+ diffused layer becomes low. It is to be noted that when the above-mentioned changes take place, one situation alone will not occur but both of them occur simultaneously.

It is to be noted that the aforementioned problems exist also in the case of Bi-CMOS integrated circuit.

BRIEF SUMMARY OF THE INVENTION

It is an object of the present invention to provide an improved manufacturing method of a well region having the same conductivity as the substrate of a CMOS semiconductor device.

It is an object of the present invention to provide an improved manufacturing method of a CMOS semiconductor device provided with a well region and a channel stopper having the same conductivity type as the substrate.

It is an object of the present invention to provide an improved manufacturing method of an N well and an N-type channel stopper which render the threshold voltage for the P-channel MOS transistor in a CMOS transistor to be high in value and free from variability.

It is an object of the present invention to provide an improved manufacturing method of an N well and an N-type channel stopper which prevents the threshold voltage for a P-channel parasitic MOS transistor in a CMOS transistor from becoming low in value and from rising its variability.

It is an object of the present invention to provide an improved manufacturing method of an N well and an N-type channel stopper which render the junction breakdown voltage for a P+ diffused layer in a CMOS integrated circuit to keep high in value and free from variability.

It is an object of the present invention to provide an improved manufacturing method of an N well and an N-type channel stopper which render the junction capacitance for a P+ diffused layer in a CMOS integrated circuit to keep high in value and free from variability.

It is an object of the present invention to provide an improved manufacturing method of an N well and an N-type channel stopper suitable for manufacturing a high density CMOS integrated circuit.

It is an object of the present invention to provide an improved manufacturing method of an N well in a Bi-COMS integrated circuit.

It is an object of the present invention to provide an improved manufacturing method of an N well and an N-type channel stopper in a Bi-CMOS integrated circuit.

A first aspect of the manufacturing method of a CMOS semiconductor device in accordance with the present invention includes the following processes. An SiO$_2$ film is formed on a main surface of a silicon substrate. A first mask is formed on a region which is to become the element formation region of a P-channel MOS transistor and on a region which is to become the element isolation region of the P-channel MOS transistor. Using a first mask, a first P-type ion implantation layer is formed on a region which is to become the element formation region of an N-channel MOS transistor and on a region which is to become the element isolation region of the N-channel MOS transistor. After removal of the first mask, a second mask is formed on the region planned for the element formation region the N-channel MOS transistor and on the region planned for the element isolation region of the N-channel MOS transistor. Using a second mask, a first N-type ion implantation layer is formed in the region planned for the element formation region of the P-channel MOS transistor in the element isolation region of the P-channel MOS transistor. After removal of the second mask, an Si$_3$N$_4$ film is formed using a third mask on the region which is to become the element formation region of the N-channel MOS transistor and on the region which is to become the element formation region of the P-channel MOS transistor. Without removing the third mask, a fourth mask is formed on the region planned for the element formation region of the P-channel MOS transistor and on the region planned for the element isolation region of the P-channel MOS transistor. Using the third and the fourth masks, a second P-type ion implantation layer is formed in the region planned for the element isolation region of the N-channel MOS transistor. After removal of the third and the fourth masks, a field oxide film is formed in the region planned for the element isolation region of the N-channel MOS transistor and in the region planned for the element isolation region of the P-channel MOS transistor, P wells are formed in the region planned for the element formation region of the N-channel MOS transistor and in the region planned for the element separation region of the N-channel MOS transistor, a P-type channel stopper is formed in the region planned for the element isolation region of the N-channel MOS transistor and N-type channel stoppers are formed in the region planned for the element formation region of the P-channel MOS transistor and in the region planned for the element isolation region of the P-channel MOS transistor. A fifth mask is formed on the P wells. Using a fifth mask, a second N-type ion implantation layer is formed in the region planned for the element isolation region of the P-channel MOS transistor. After removal of the fourth mask, the second N-type ion implantation layer is activated by a heat treatment, and an N well is formed in the region planned for the element isolation region of the P-channel MOS transistor.

It is preferable that the impurity forming the first and the second N-type ion implantation layers is phosphorus.

It is preferable that the dose for the first N-type ion implantation layer is smaller than the dose for the second N-type ion implantation layer.

It is preferable that the dose for the first N-type ion implantation layer is not less than $1 \times 10^{12}$ cm$^{-2}$.

A second aspect of the formation method of an N well of a CMOS integrated circuit in accordance with the present invention includes the following processes. A P$^+$-type buried diffused layer is formed in the region where the upper part in a main surface of a silicon substrate is to become the element formation region of an N-channel MOS transistor, and an N$^+$-type buried diffused layer is formed in the region where the upper part in the main surface of the silicon substrate is to become the element formation region of a P-channel MOS transistor. An N-type silicon epitaxial layer is formed on the main surface of the silicon substrate. An SiO$_2$ film is formed on the surface of the N-type silicon epitaxial layer. A first mask is formed on the region which is to become the element formation region of the P-channel MOS transistor and on the region which is to become the element isolation region of the P-channel MOS transistor. Using the first mask, a first P-type ion implantation layer is formed in the region which is to become the element formation region of the N-channel MOS transistor and in the region which is to become the element isolation region of the N-channel MOS transistor. After removing the first mask, a second mask is formed on the region planned for the element formation region of the N-channel MOS transistor and on the region planned for the element isolation region of the N-channel MOS transistor. Using the second mask, a first N-type ion implantation layer is formed in the region planned for the element formation region of the P-channel MOS transistor and in the region planned for the element separation region of the P-channel MOS transistor. After removal of the second mask, an Si$_3$N$_4$ film is formed using a third mask on the region planned for the element formation region of the N-channel MOS transistor and on the region planned for the element formation region of the P-channel MOS transistor. Without removing the third mask, a fourth mask is formed on the region planned for the element formation region of the P-channel MOS transistor and on the region planned for the element isolation region of the P-channel MOS transistor. Using the third and fourth masks, a second P-type ion implantation layer is formed in the region planned for the element isolation region of the N-channel MOS transistor. After removing the third and the fourth masks, field oxide films are formed in the region planned for the element isolation region of the N-channel MOS transistor and in the region planned for the element isolation region of the P-channel MOS transistor, P wells are formed in the region planned for the element formation region of the N-channel MOS transistor and in the region planned for the element isolation region of the N-channel MOS transistor, a P-type channel stopper is formed in the region planned for the element isolation region of the N-channel MOS transistor and N-type channel stoppers are formed in the region planned for the element formation region of the P-channel MOS transistor and in the region planned for the element isolation region of the P-channel MOS transistor. A fifth mask is formed on the P wells. Using the fifth mask, a second N-type ion implantation layer is formed in the region planned for the element isolation region of the P-channel MOS transistor. After removing the fourth mask, the second N-type ion implantation layer is activated by a heat treatment, and an N well is formed in the region planned for the element isolation region of the P-channel MOS transistor.

It is desirable that the impurity for forming the first and the second N-type ion implantation layers is phosphorus.

It is desirable that the dose of the first N-type ion implantation layer is smaller than the dose of the second N-type ion implantation layer.

It is desirable that the dose of the first N-type ion implantation layer is not less than $1 \times 10^{12}$ cm$^{-2}$.

By the adoption of the formation method of the CMOS integrated circuit described in the above, the concentration of the N-type impurity in the boundary region between the N well and the N-type channel stopper becomes uniform. As a result, problems occurred in the conventional device that the threshold voltage of the P-channel MOS transistor becomes locally high and that the junction breakdown voltage of the P$^+$ diffused layer becomes low or the problems seen in the conventional device that the threshold voltage of the P-channel parasitic MOS transistor becomes low and that the junction capacitance of the P$^+$ diffused layer becomes low or high, can be dissolved.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1A:
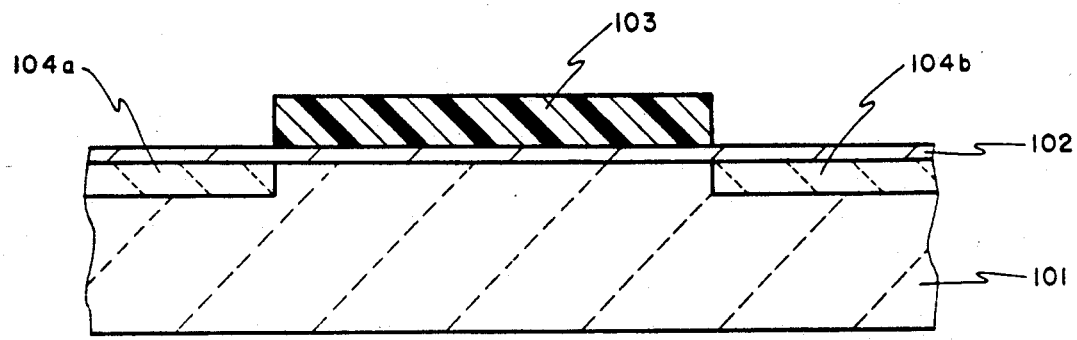
FIGS. 1A to 1G are the schematic vertical sectional views arranged in the order of processes for explaining the formation method of N wells of a CMOS integrated circuit in accordance with a first embodiment of the present invention.
Figure 1B:
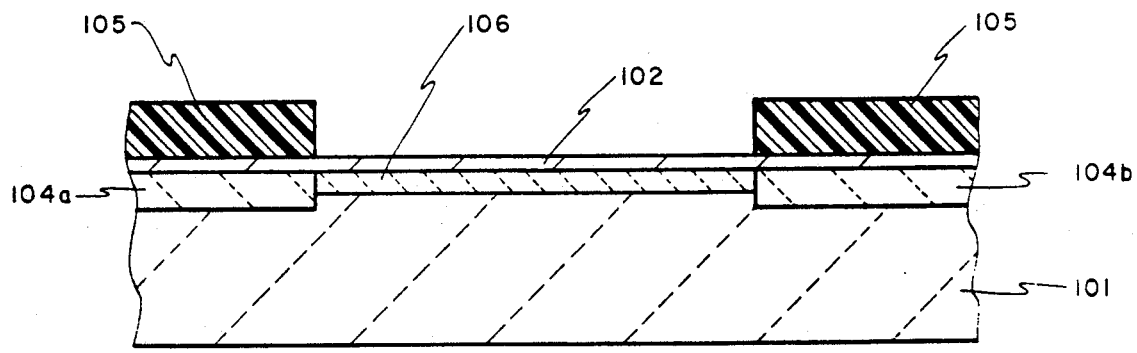
Figure 1C:
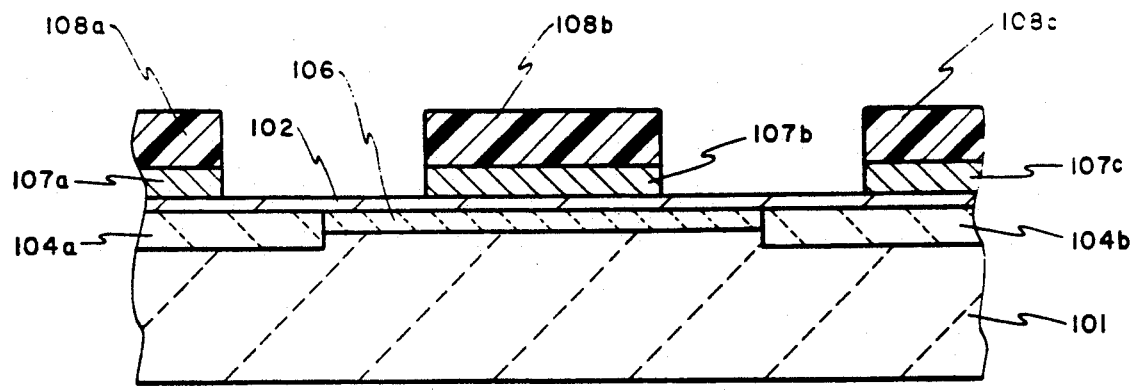
Figure 1D:
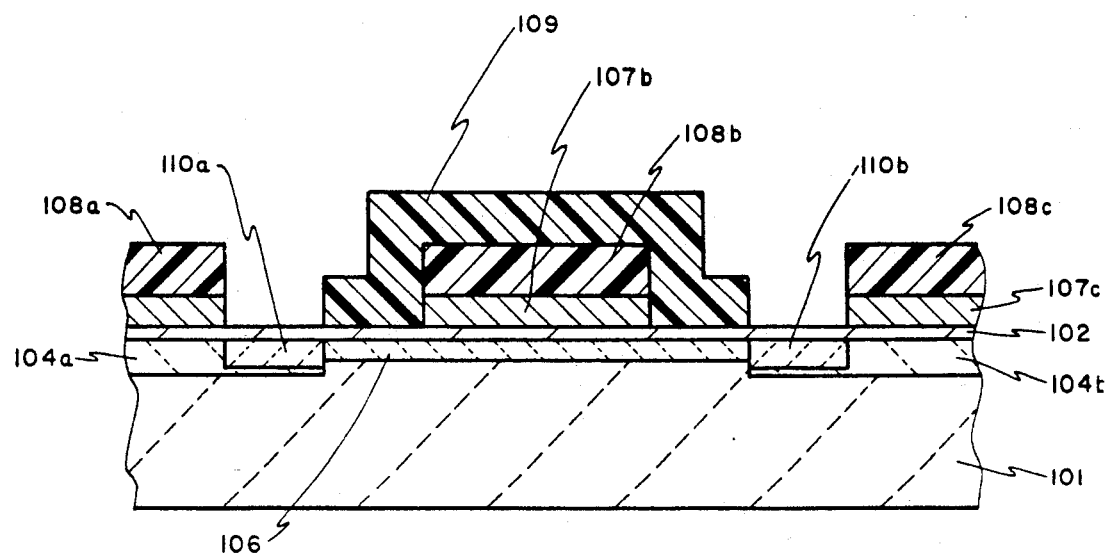

Referring to the accompanying drawings, the present invention will be described in detail in the following.

FIGS. 1A to 1G are schematic vertical sectional views as arranged in the order of processes for explaining the formation method of an N well of a CMOS integrated circuit in accordance with the first embodiment of the present invention.

First, on an N-type silicon substrate 101 with impurity concentration of about $5 \times 10^{15}$ cm$^{-3}$, there is formed an SiO$_2$ film 102 of thickness of about 60 nm. Then, a photoresist film 103 which is a first mask is formed on a region which is to become the element formation region of a P-channel MOS transistor and on a region which is to become the element isolation region of the P-channel MOS transistor. First P-type ion implantation layers 104a and 104b are formed by implanting boron ions of energies of 100 to 150 keV and a dose of $(5 \text{ to } 10) \times 10^{12}$ cm$^{-2}$ in the region which is to become the element formation region of an N-channel MOS transistor and in the region which is to become the element isolation region of the N-channel MOS transistor by using the photoresist film 103 as the mask {FIG. 1A}.

Next, after removing the photoresist film 103, photoresist films 105 which constitute a second mask are formed on the region which is to become the element formation region of the N-channel MOS transistor and on the region which to become the element isolation region of the N-channel MOS transistor. The alignment accuracy of each photoresist film is ±0.3 μm. Using the photoresist films 105 as the mask, a first N-type ion implantation layer 106 is formed by implanting phosphorus ions of energies of 100 to 150 keV and a dose of $(1 \text{ to } 2) \times 10^{-13}$ cm$^{-2}$ on the region which is to become the element isolation region of the P-channel MOS transistor and on the region which is to become the element formation region of the P-channel MOS transistor {FIG. 1B}.

Next, after removing the photoresist films 105, an Si$_3$N$_4$ film is deposited on the surface of the SiO$_2$ film 102 to a thickness of 100 to 200 nm. Photoresist films 108a, 108b and 108c which constitute a third mask are formed on the Si$_3$N$_4$ film. Then, the Si$_3$N$_4$ film is etched using the photoresist films 108a, 108b and 108c as the mask to leave the Si$_3$N$_4$ films 107a, 107b and 107c. Note that the Si$_3$N$_4$ films 107a and 107c remain on the regions which are to become the element formation regions of the N-channel MOS transistors while the Si$_3$N$_4$ film 107b remains on the region which is to become the element formation region of the P-channel MOS transistor {FIG. 1C}.

Next, a photoresist film 109 which is a fourth mask is formed without removing the photoresist films 108a, 108b and 108c. The photoresist film 109 is formed on the region which is to become the element formation region of the P-channel MOS transistor and on the region which is to become the element isolation region of the P-channel MOS transistor. Using the photoresist film 109, the photoresist films 108a, 108b and 108c and the Si$_3$N$_4$ films 107a, 107b and 107c as the masks, second P-type ion implantation layers 110a and 110b are formed by implanting boron ions of energies 100 to 150 keV and a dose of $(1 \text{ to } 2) \times 10^{13}$ cm$^{-2}$ {FIG. 1D}. It should be mentioned that the purpose of leaving the photoresist films 108a and 108c is to prevent the implantation of boron into the region which is to become the element formation region of the N-channel MOS transistor.

Next, the photoresist film 109 and the photoresist films 108a, 108b and 108c are removed. Then, using the Si$_3$N$_4$ films 107a, 107b and 107c as the masks, field oxide films 111a and 111b with thickness of 500 to 800 nm are selectively formed in the region which is to become the element isolation regions of the P-channel and the N-channel MOS transistors. The oxidation for this process is performed at 980° C. within a mixed atmosphere of H$_2$ and O$_2$.

Simultaneous with the formation of the field oxide films the following regions are formed. Namely, in the region which is to become the element isolation region of the N-channel MOS transistor and in the region which is to become the element formation region of the N-channel MOS transistor there are formed P wells 124a and 124b by the activation of the first P-type ion implantation layers 104a and 104b, respectively. In the regions which are to become element isolation regions of the N-channel MOS transistors, there are formed P-type channel stoppers 130a and 130b by the activation of the second P-type ion implantation layers 110a and 110b. In the region which is to become the element isolation region of the N-channel MOS transistor, there is formed an element isolation region of the N-channel MOS transistor consisting of a field oxide film and a P-type channel stopper. In the region which is to become the element isolation region of the P-channel MOS transistor and the region which is to become the element formation region of the P-channel MOS transistor there is formed an N-type channel stopper 126 by the activation of the first N-type ion implantation layer 106. It is to be noted that the depth of the diffused layer of the N-type channel stopper 126 is different for the region which is to become the element isolation region of the P-channel MOS transistor and for the region which is to become the element formation region of the P-channel MOS transistor. In the region which is to become the element isolation region of the P-channel MOS transistor there is formed the element isolation region of a P-channel MOS transistor consisting of a field oxide film and an N-type channel stopper {FIG. 1E}.

In this case, the depth in the vertical direction of the diffused layers of the P-channel stoppers 130a and 130b is 0.7 to 1.0 μm. In addition, the vertical depth of the diffused layer of the N-channel stopper 126 is 0.19 to 0.24 μm. Because of this, the sum of the horizontal spreads of the diffused layers of the P-channel stoppers 130a and 130b (or the P wells 124a and 124b) and the N-type channel stopper 126 is larger than the alignment accuracy. As a result, no slit will be formed between the N-type channel stopper and the P-channel stopper (or the P well).

Following that, the SiO$_2$ film 102 is removed by etching, and a gate oxide film 112 with thickness of about 20 μm is formed in its place. Then, photoresist films 113 which constitute a fifth mask are formed on the P wells 124a and 124b. It is to be noted that the alignment accuracy of the photoresist films 113 is not too important. Following that, a second N-type ion implantation layer 114 is formed by implanting phosphorus ions of energies 100 to 150 keV and a dose of $(5\ to\ 10) \times 10^{12}$ cm$^{-2}$ by using the photoresist films 113 and the field oxide films 11a and 11b. As a result of the ion implantation, the N-type channel stopper 126 is divided into N-type channel stoppers 126a and 126b. In this ion implantation, ions will not be implanted into the N-type channel stopper of the element isolation region of the P-channel MOS transistor since the field oxide films 111a and 111b is thick enough {FIG. 1F}.

Next, the photoresist film 113 is removed, and a heat treatment is given in an N$_2$ atmosphere at 900° C. for 1 hour. As a result, the second N-type ion implantation layer 114 is activated, and there is formed an N well 134 in the region which is to become the element formation region of the P-channel MOS transistor {FIG. 1G}. The vertical depth of the diffused layer of the N well 134 is 0.41 to 0.43 μm. It is to be noted here that the horizontal spread of the N-well diffused layer due to the heat treatment is almost negligible.

Thereafter, the fabrication method follows that of the conventional CMOS transistor.

Figure 1E:
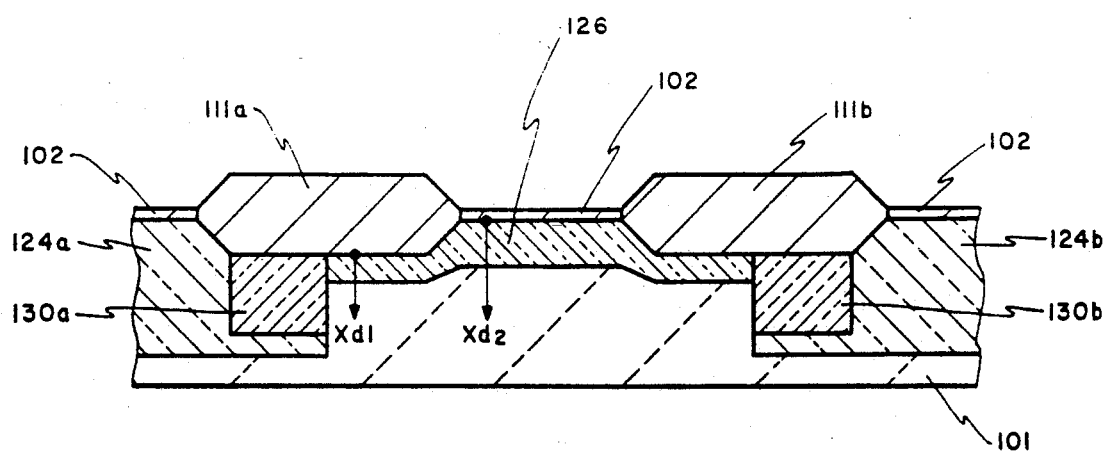
Figure 1F:
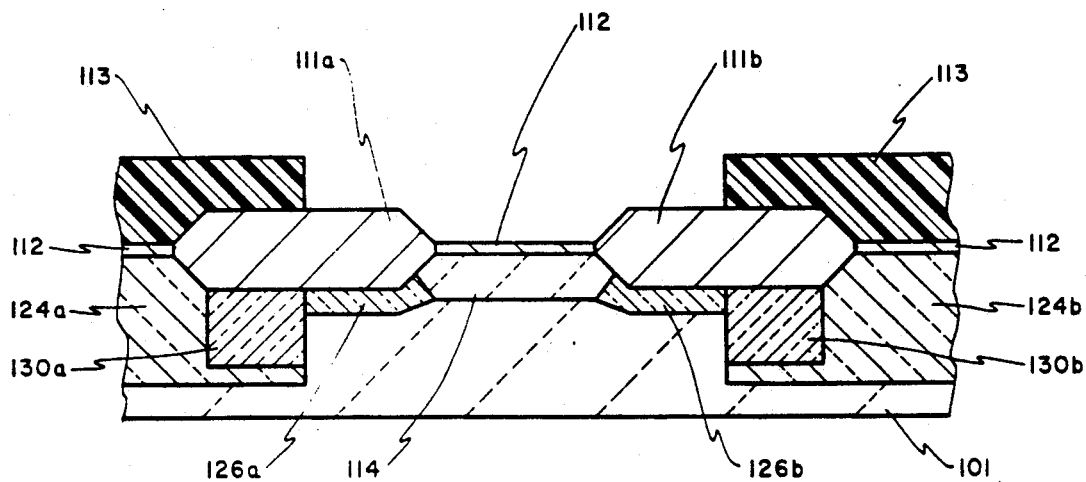
Figure 1G:
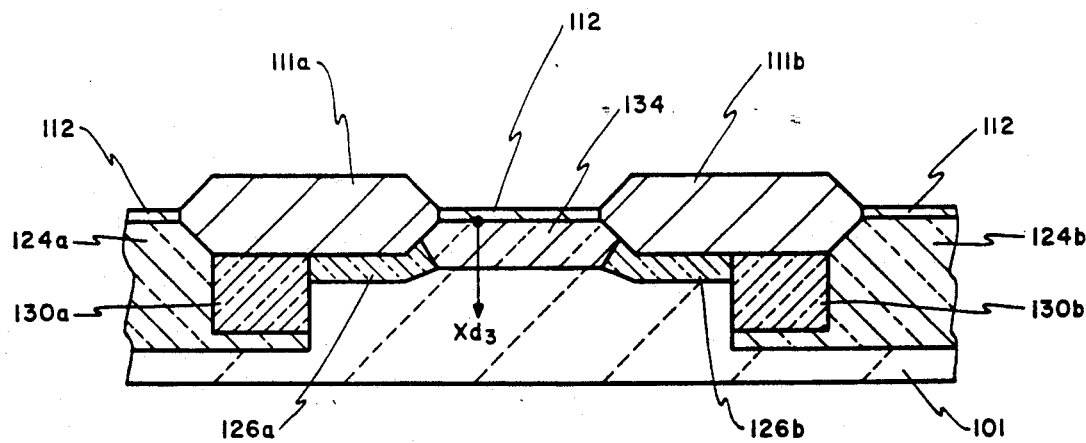
Figure 2A:
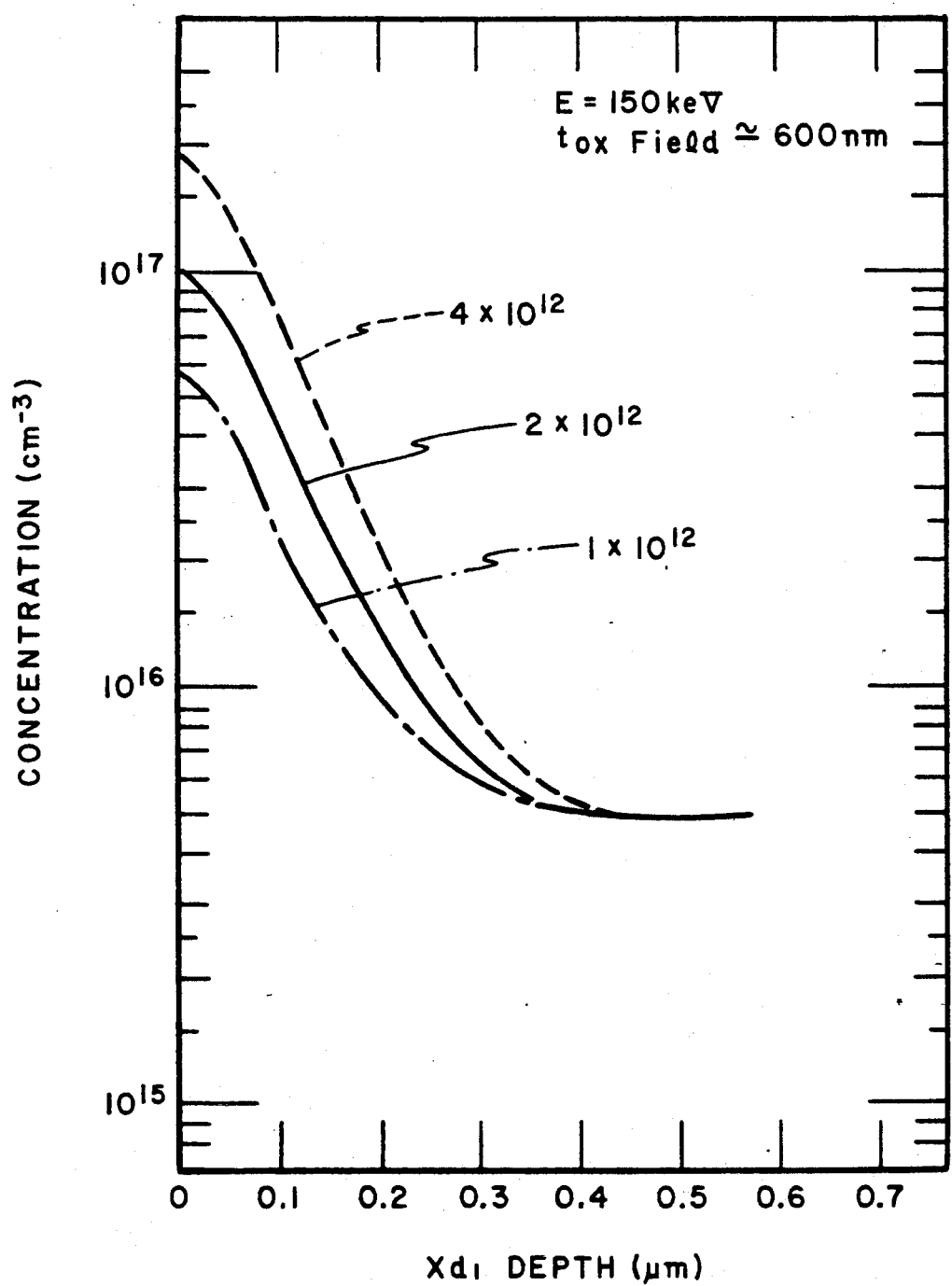
FIG. 2A is a graph showing the depth profile, in the direction of $X_{d1}$ in FIG. 1E, of an N-type channel stopper immediately beneath a field oxide film in the first embodiment of the present invention.
Figure 2B:
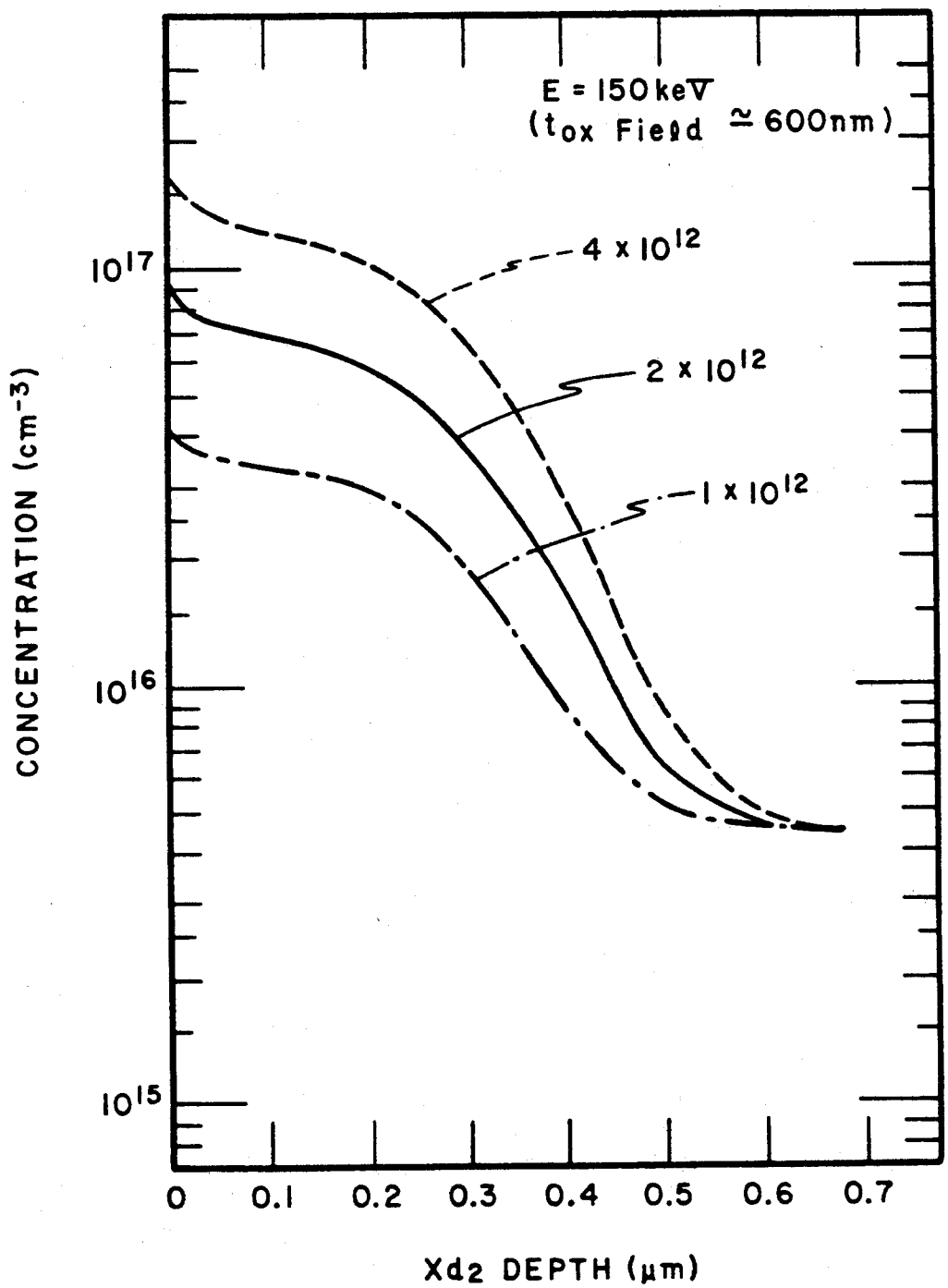
FIG. 2B is a graph showing the depth profile, in the direction of $X_{d2}$ in FIG. 1E, of the N-type channel stopper in the element isolation region of a P-channel MOS transistor in the first embodiment of the present invention.
Figure 2C:
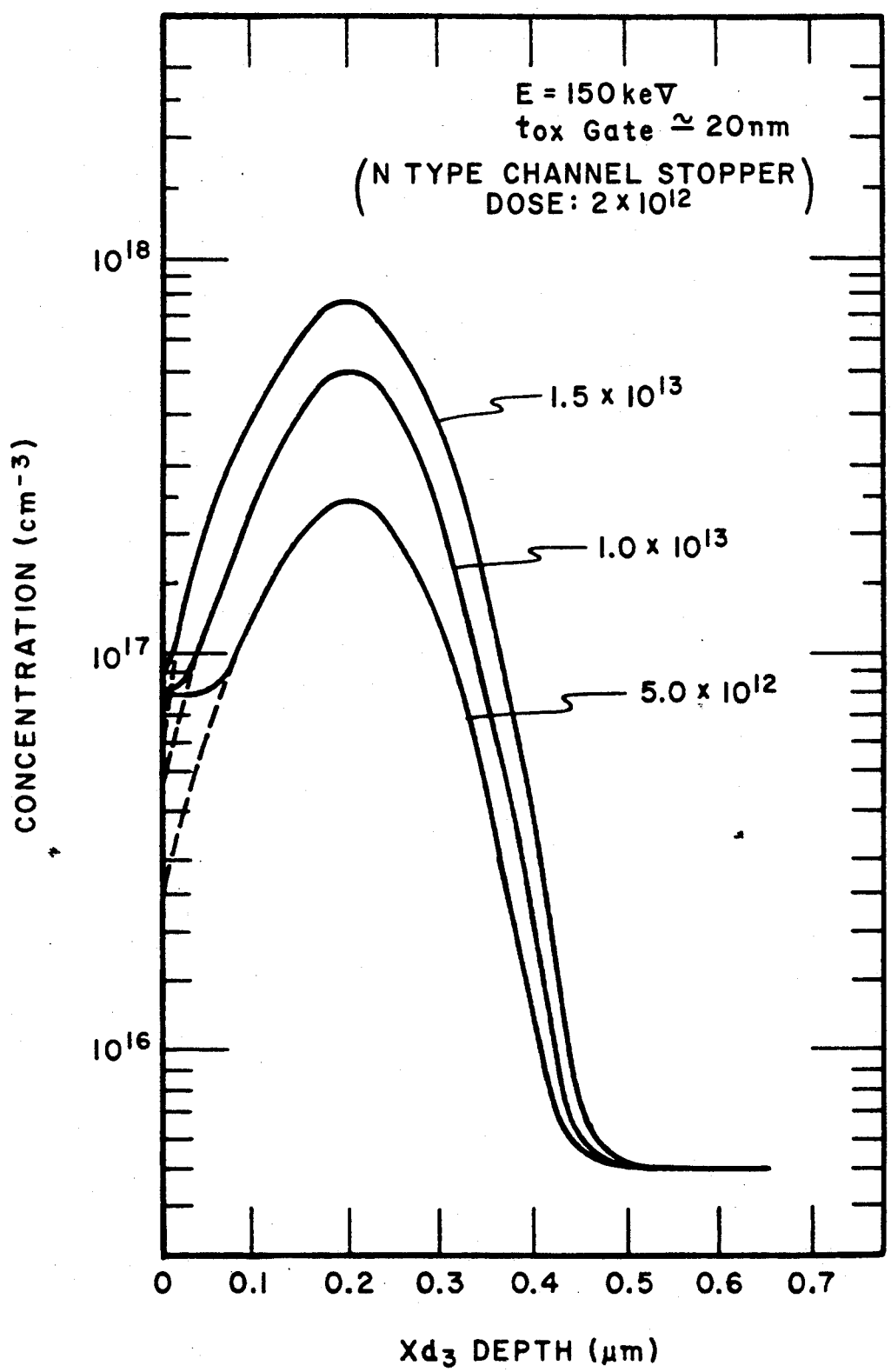
FIG. 2C is a graph showing the depth profile, in the direction of $X_{d3}$ in FIG. 1G, of the N well in the first embodiment of the present invention.

FIGS. 2A and 2B are graphs that show examples of the depth profile of the N-type channel stopper 126 immediately below the field oxide film and the depth profile of the N-type channel stopper 126 in the region which is become the element formation region of the P-channel MOS transistor, at the stage shown in FIG. 1E. In addition, FIG. 2C is a graph that show an example of the depth profile of the N well 134 in the stage of FIG. 1G. These profiles were measured by means of a secondary ion mass spectroscope.

FIGS. 2A and 2B are representing the data for the doses of $1 \times 10^{12}$ cm$^{-2}$, $2 \times 10^{12}$ cm$^{-2}$ and $4 \times 10^{12}$ cm$^{-2}$ when the implantation energy is 150 keV and the thickness of the field oxide film is 600 nm. FIG. 2B shows that phosphorus is implanted deeply by a simple thermal diffusion. FIG. 2A shows that phosphorus is piled up in the interface between the field oxide film and the silicon substrate in the process of thermal oxidation of the surface of the silicon substrate, and shows that phosphorus is not diffused deeply. The impurity concentration near the surface in the highest at directly below the field oxide film, and the concentration is a value sufficient to function as a channel stopper.

It should be noted that the simultaneous formation of the N well at the above-mentioned concentration is not possible. The reason for this is as follows. As shown in FIG. 2B, the profile does not have peaks in the portion of the depth of 0.2 to 0.3 μm. Further, the concentration of this portion is not high enough. When a P-channel MOS transistor is formed under the above-mentioned profile, the growth of the depletion layer cannot be checked, and a punch-through tends to appear.

On the contrary, if the impurity concentration at the portion of the depth of 0.2 to 0.3 μm is raised by increasing the dose of ion implantation, it becomes possible to prevent the punch-through. However, the quantity of the second ion implantation has to be increased because of the increase in the surface concentration. Then, the hole mobility is reduced due to scattering by high concentration impurity in the holes of this portion, giving rise to the same difficulty in the prior art. The concentration of the N-type channel stopper is raised still further which will lead to a reduction in the junction breakdown voltage and an increase in the junction capacitance between the P+ diffused layer of the P-channel MOS transistor and the N-type channel stopper.

FIG. 2C shows the depth profile when the N-type channel stopper is formed by an ion implantation of energy of 150 keV and dose of $2 \times 10^{12}$ cm$^{-2}$, then the N well is formed by an ion implantation with energy of 150 keV. In the figure, the broken line indicates the case when these is no N-type channel stopper. Although the influence of the N-type channel stopper is observable to some extent as far as the surface temperature is concerned, its influence on the element characteristics is slight if the influence remains on this level since there is formed a buried layer using a P-type layer.

In accordance with the present embodiment, the impurity concentration in the portion where the N well and the N-type channel stopper are brought into contact becomes uniform. Therefore, the problem in which the threshold voltage of the P-channel MOS transistor shows a local rise along with a reduction in the junction breakdown voltage of the P+ diffused layer which is observed in the conventional device, or the problem of a reduction in the threshold voltage of the P-channel parasitic MOS transistor and the problem of a reduction or an increase in the junction capacitance of the P+ diffused layer that are seen in the conventional device can be eliminated.

Note, however, that when the dose of ion implantation for the N-type channel stopper is raised, the impurity concentration of the surface becomes large, and the effect of the present embodiment is diminished. Although the upper limit of the dose is a matter that belongs to design items, it may be pointed out that for a dose of about $4 \times 10^{12}$ cm$^{-2}$ the surface concentration is about $2 \times 10^{17}$ cm$^{-3}$. This makes large the boron dose at the time of formation of the buried channel with a P-type layer, which is not desirable. The dose is preferable to be less than about $3 \times 10^{12}$ cm$^{-2}$.

Figure 3A:
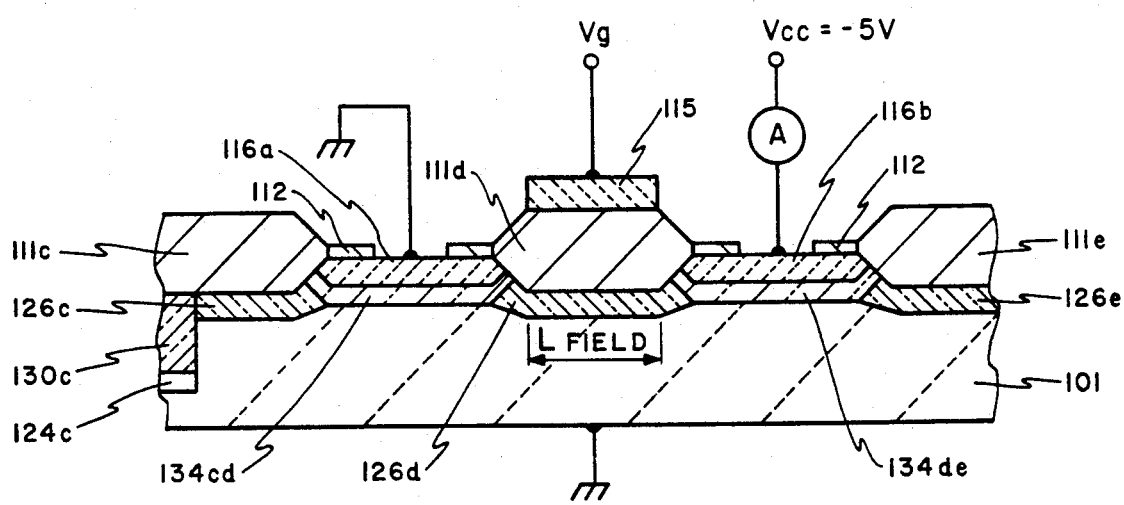
FIG. 3A is a schematic view for explaining the measurement of the threshold voltage for a P-channel parasitic MOS transistor when a semiconductor device is formed by using the N well and the N-type channel stopper in accordance with the first embodiment of the present invention.
Figure 3B:
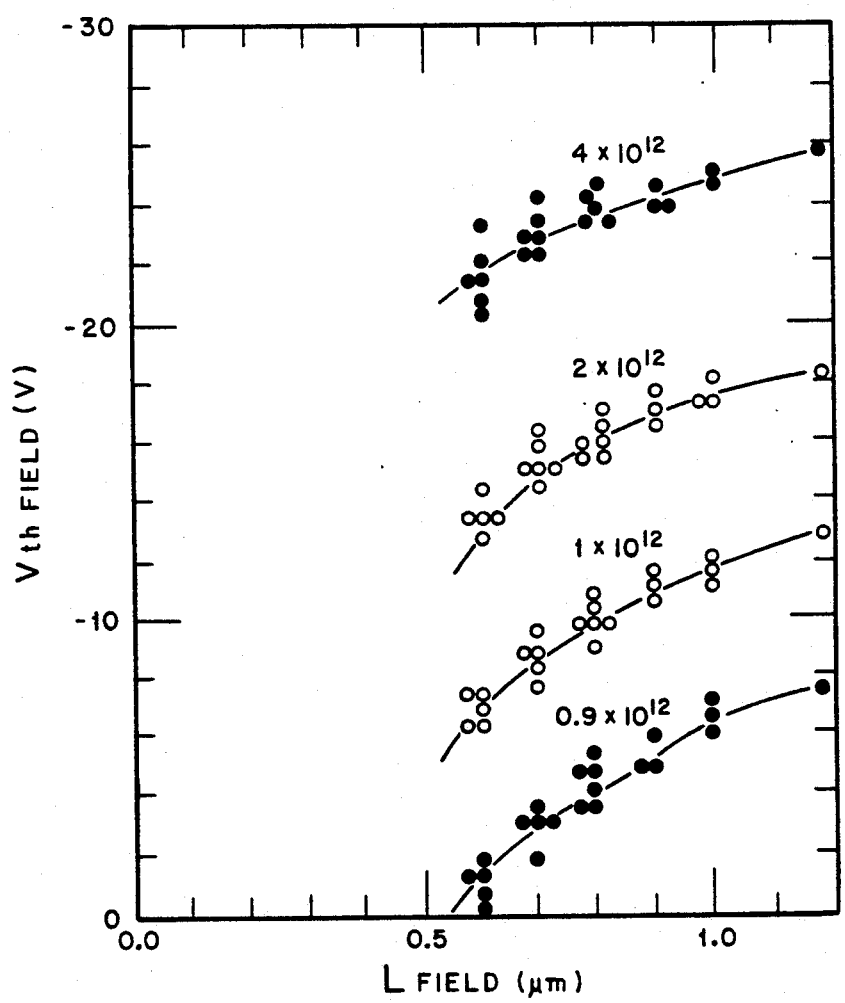
FIG. 3B is a graph showing the threshold voltage for the P-channel parasitic MOS transistor measured by the method shown in FIG. 3A.

FIGS. 3A and 3B are a schematic diagram for explaining the method of measuring the threshold voltage of the P-channel parasitic MOS transistor by forming a semiconductor device in the N well of the present embodiment, and a graph showing the result of the measurement.

First, referring to FIG. 3A, the measurement method will be described. After forming on a silicon substrate 101, a P well 124c, N wells 134cd 134de, a P-type channel stopper 130c, N-type channel stoppers 126c, 126d and 126e and field oxide films 111c, 111d and 111e, P+ diffused layers 116cd and 116de are formed in the N well 134cd and 134de and an N-type polycrystalline silicon gate electrode 115 is formed in the field oxide film 111d. Regarding the field oxide film 111d as a gate insulating film, a voltage Vg is applied to the N-type polycrystalline silicon gate electrode 115. The P+ diffused layer 116cd is regarded as a source, and it is connected to the ground along with the silicon substrate 101. The P+ diffused layer 116de is regarded as a drain to which is applied a voltage Vcc (= −5 V). The gate electrode may have a polycide structure consisting of a laminated film of an N-type polycrystalline silicon film and a high-melting point metallic silicide film. The threshold voltage ($V_{th\ Field}$) of the P-channel parasitic MOS transistor is obtained by measuring the drain current by varying the Vg.

FIG. 3B is a graph showing the dependence of the threshold voltage ($V_{th\ Field}$) of the P-channel parasitic MOS transistor on the length ($L_{Field}$) of the field oxide film, using the dose of the phosphorus ions that form the N-type channel stopper as the parameter. From the figure, the lower limit value of $1 \times 10^{12}$ cm$^{-2}$ for the dose of the phosphorus ions that form the N-type channel stopper can be seen clearly. This value can be obtained from the requirement that $|V_{th\ Field}|$ be not less than 5 V. If the dose is not less than the indicated value, it becomes possible to employ the present embody to 0.6 μm process.

Figure 4A:
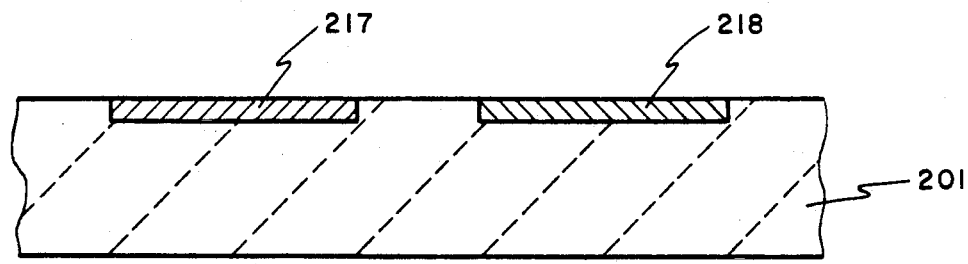
FIGS. 4A to 4C are schematic vertical sectional views of important processes for explaining the formation method of the N well of a Bi-CMOS integrated circuit in accordance with a second embodiment of the present invention.
Figure 4B:
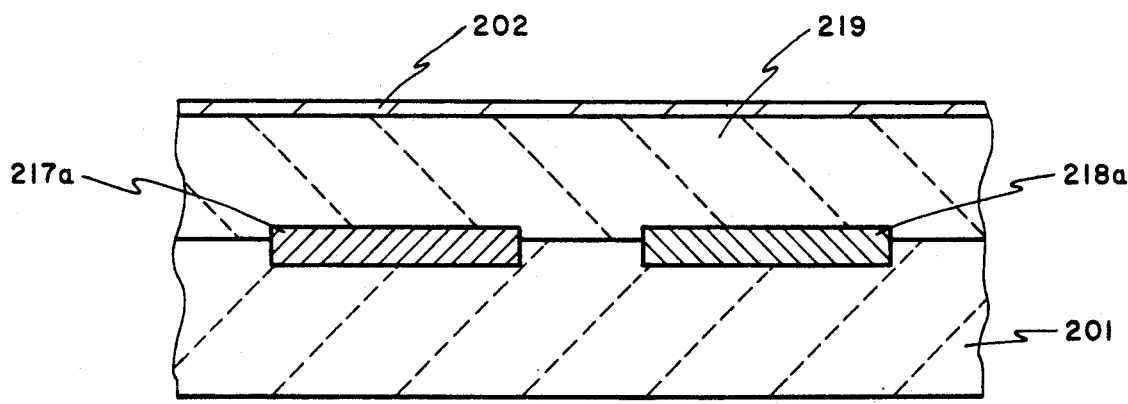
Figure 4C:
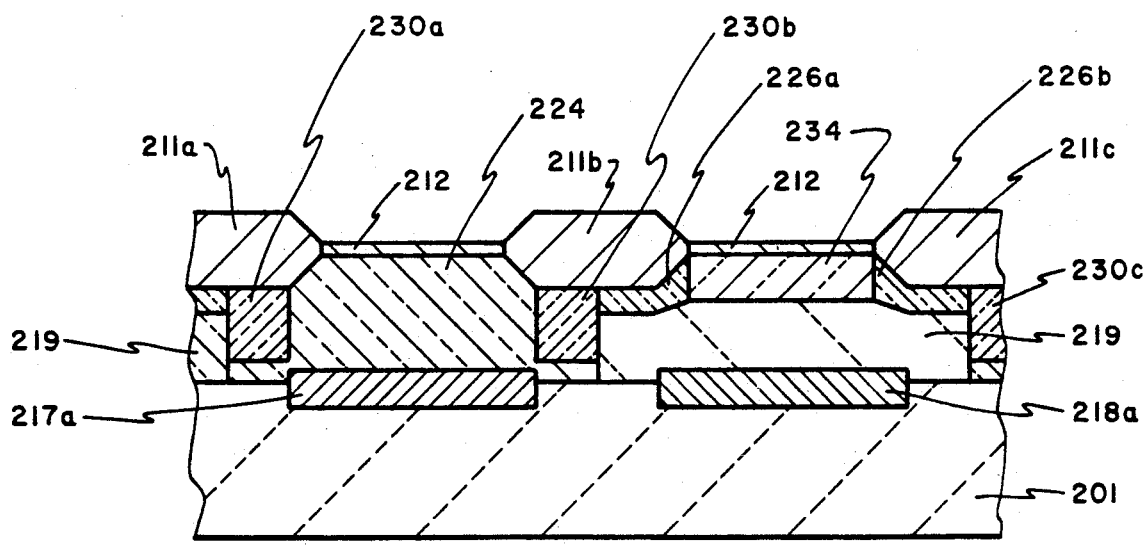

Next, FIGS. 4A to 4C are schematic vertical sectional views of the main processes for explaining a second embodiment of the present invention. The present embodiment relates to a formation method of an N well for a Bi-CMOS transistor.

First, a P+-type buried diffused layer 217 and an N+-type buried diffused layer 218 are formed in a region which is to becomes the element formation region of an N-channel MOS transistor and in a region which is to become the element formation region of a P-channel MOS transistor, respectively, on the surface of a P-type silicon substrate 201 {FIG. 4A}.

Next, on the surface of the P-type silicon substrate 201, there is formed an N-type silicon epitaxial layer 219. The growth temperature of the layer is about 1050° C., its thickness is about 1.0 μm and its resistivity is 0.74 to 1.26 Ω·cm. During the growth process, the thickness of the diffused layers of the P+-type buried diffused layer 217 and the N+-type buried diffused layer 218 are increased by thermal diffusion, and are converted to a P+-type buried diffused layer 217a and an N+-type buried diffused layer 218b. Then, an SiO$_2$ layer 202 with thickness of about 60 nm is formed on the surface of the N-type silicon epitaxial layer 219 {FIG. 4B}.

Thereafter, the processes are similar to the first embodiment of the present invention. Namely, simultaneous with the formation of the field oxide films 211a, 211b and 211c, there are formed P-type channel stoppers 230a, 230b and 230c, an N-type channel stopper and a P well 224. The P well 224 is connected to the P+-type buried diffused layer 217. Further, after the formation of a gate oxide film 212, an N well 234 is formed, and along with it the N-type channel stopper is split into N-type channel stoppers 226a and 226b {FIG. 4C}.

The effects of the present embodiment include all of the effects of the first embodiment of the present invention. Moreover, the use of an epitaxial layer makes the present embodiment latch-up free.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A manufacturing method of CMOS integrated circuit device comprising the steps of:
   ion-implanting first impurities into a MOS transistor area defined at a main surface portion of a semiconductor substrate, said first impurities representing a conductivity type that is equal to a conductivity type of said semiconductor substrate and said MOS transistor area having an element formation region and an isolation region;
   forming an oxidation-resist film to cover said element formation region of said MOS transistor area except said isolation region;
   performing oxidation treatment by using said oxidation-resist film as a mask to form a field oxide film embedded partially in said isolation region and to form a channel stopper under said field oxide film by said first impurities; and
   ion-implanting second impurities representing the same conductivity type of said first impurities into said element formation region by using said field oxide film as a mask thereby to form a well region having a predetermined impurity profile in said element formation region.

2. The manufacturing method of a CMOS integrated circuit device as claimed in claim 1, wherein said conductivity type is N type and each of said first and second impurities is phosphorus.

3. The manufacturing method of a CMOS integrated circuit device as claimed in claim 1, wherein the dose of said first impurities is smaller than the dose of the said second impurities.

4. The manufacturing method of a CMOS integrated circuit device as claimed in claim 1, wherein the dose of said first impurities is not less than $1 \times 10^{12}$ cm$^{-2}$.

5. A method of manufacturing CMOS integrated circuit device comprising the steps of:
   selectively forming a buried layer of an N-type in a main surface portion of a silicon substrate of a P-type;
   forming a silicon epitaxial layer of said N-type on the main surface of said silicon substrate, said silicon epitaxial layer having said conductivity type;
   doping first impurities into a MOS transistor area defined at a surface portion of said silicon epitaxial layer, said first impurities representing said N-type and said MOS transistor area facing said buried layer and having an element formation region and an isolation region;
   forming an oxidation-resist film to cover said element formation region of said MOS transistor area except said isolation region;
   performing oxidization treatment to said substrate by using said oxidation-resist film as a mask thereby to form a field oxide film embedded partially in said isolation region and to form a channel stopper under said field oxide film by converting said first impurities thereto; and doping second impurities representing said N-type
into said element formation region by using said
field oxide film as a mask to from a well region of
said N-type having a predetermined impurity pro-
file in said element formation region.

6. The manufacturing method of a CMOS integrated
circuit device as claimed in claim 5, wherein each of
said first and second impurities is phosphorus.

7. The manufacturing method of a CMOS integrated
circuit device as claimed in claim 5, wherein the dose of
said first impurities is smaller than the dose of said sec-
ond impurities.

8. The manufacturing method of a CMOS integrated
circuit device as claimed in claim 5, wherein the dose of
said first impurities is not less than $1 \times 10^{12}$ cm$^{-2}$.

9. A manufacturing method of a CMOS integrated
circuit comprising:

a step of forming an SiO$_2$ film on a main surface of an
N-type silicon substrate;

a step of forming a first mask on a first element forma-
tion region for forming a P-channel MOS transistor
and on a first element isolation region of the P-
channel MOS transistor;

a step of forming first P-type ion implantation layers
in a second element formation region for forming
an N-channel MOS transistor and in a second ele-
ment isolation region of the N-channel MOS tran-
sistor, by using said first mask;

a step of forming a second mask on said second ele-
ment formation region and on said second element
isolation region, after removing said first mask;

a step of forming first N-type ion implantation layers
in said first element formation region and in said
second element isolation region by using said sec-
ond mask;

a step of removing said second mask;

a step of forming an oxidation-resist film all over the
top surface;

a step of forming a third mask on said first and second
element formation regions;

a step of etching said oxidation-resist film by using
said third mask;

a step of forming a fourth mask on said first element
formation region and on said first element isolation
region by not removing said third mask;

a step of forming a second P-type ion implantation
layer on said second element isolation region by
using said second mask and said fourth mask;

a step of removing said third mask and said fourth
mask;

a step of performing heat treatment to said substrate
thereby to form P wells by converting said first
P-type ion implantation layers thereto, to form
N-type channel stopper by converting said first
N-type ion implantation layers thereto, to form a
P-type channel stopper by converting said second
P-type ion implantation layer thereto and to form a
field insulator film in said first and second element
isolation regions by using said oxidation-resist film;

a step of forming a fifth mask on said P wells; a step
of forming a second N-type ion implantation layer
in said first element formation region by using said
fifth mask;

a step of removing said fifth mask; and a step of performing heat treatment to form an N well
by said second N-type ion implantation layer.

10. The manufacturing method of a CMOS integrated
circuit as claimed in claim 9, wherein the N-type impu-
rities of said N-type channel stoppers and said N well
are phosphorus.

11. The manufacturing method of a CMOS integrated
circuit as claimed in claim 9, wherein the dose of ions
used for forming said first N-type ion implantation lay-
ers is smaller than the dose of ions used for forming said
second ion implantation layer.

12. The manufacturing method of a CMOS integrated
circuit as claimed in claim 9, wherein the dose of ions
for forming said first N-type ion-implantation layers is
not less than $1 \times 10^{12}$ cm$^{-2}$.

13. A manufacturing method of a CMOS integrated
circuit comprising:

a step of forming an N$^+$-type buried diffused layer in
a region which is to become the element formation
region of a P-channel MOS transistor in the upper
part on a main surface of a silicon substrate, and
forming a P$^+$-type buried implantation layer in a
region which is to become the element formation
region of an N-channel MOS transistor in the
upper part of the main surface of the silicon sub-
strate;

a step of forming an N-type silicon epitaxial layer on
the main surface of said silicon substrate;

a step of forming an SiO$_2$ film on the surface of said
N-type silicon epitaxial layer;

a step of forming a first mask on said region which
becomes the element formation region of the P-
channel MOS transistor and a region which is to
become the element isolation region of the P-chan-
nel MOS transistor;

a step of forming first P-type implantation layers in
said region which is to become the element forma-
tion region of the N-channel MOS transistor and in
a region which is to become the element isolation
region of the N-channel MOS transistor, by using
said first mask;

a step of forming a second mask, by removing said
first mask, on said region which is to become the
element formation region of the N-channel MOS
transistor and on said region which is to become
the element isolation region of the N-channel MOS
transistor;

a step of forming first N-type ion implantation layers
in said region which is to become the element for-
mation region of the P-channel MOS transistor and
in said region which is to become the element isola-
tion region of the P-channel MOS transistor, by
using said second mask;

a step of removing said second mask;

a step of forming an Si$_3$N$_4$ film all over the top sur-
face;

a step of forming a third mask on said region which is
to become the element formation region of the
N-channel MOS transistor and on said region
which is to become the element formation region
of the P-channel MOS transistor;

a step of etching said Si$_3$N$_4$ film by using said third
mask;

a step of forming a fourth mask on said region which
is to become the element formation region of the
P-channel MOS transistor and on said region
which is to become the element isolation region of
the P-channel MOS transistor, by not removing
said third mask;

a step of forming a second P-type ion implantation
layer on said region which is to become the ele-
ment isolation region of the N-channel MOS transistor, by using said third mask and said fourth mask;

a step of removing said third mask and said fourth mask;

a step of performing heat treatment to said silicon substrate thereby to convert said first P-type ion implantation layers to P well, to convert said first N-type ion implantation layers to N-type channel stoppers, to convert said second P-type ion implantation layer to a P-type channel shopper and to form field oxide films in said region which is to become the element isolation region of the N-channel MOS transistor and in said region which is to becomes the element isolation region of the P-channel MOS transistor by suing said $Si_3N_4$ film;

a step of forming a fifth mask on said P wells;

a step of forming a second N-type ion implantation layer on said region which is to become the element formation region of the P-channel MOS transistor, by using said fifth mask;

a step of removing said fifth mask; and a step of performing said second N-type ion implantation layer.

14. The manufacturing method of a CMOS integrated circuit as claimed in claim 13, wherein the N-type impurity of said N-type channel stoppers and said N well is phosphorus.

15. The manufacturing method of a CMOS integrated circuit as claimed in claim 13, wherein the dose of ions used for forming said first N-type ion implantation layers is smaller than the dose of ions used for forming said second N-type ion implantation layer.

16. The manufacturing method of a CMOS integrated circuit as claimed in claim 13, wherein the dose of ions used for said first N-type ion implantation layer is not less than $1 \times 10^{12}$ cm$^2$.

* * * * *